United States Patent
Yokoi et al.

(10) Patent No.: US 9,383,422 B2
(45) Date of Patent: Jul. 5, 2016

(54) MAGNETIC RESONANCE IMAGING APPARATUS AND MAGNETIC RESONANCE IMAGING METHOD

(71) Applicants: Motohisa Yokoi, Nasushiobara (JP); Kanta Kobuchi, Otawara (JP); Sho Kawajiri, Nasushiobara (JP); Masaaki Yamanaka, Nasushiobara (JP); Naoki Imamura, Nasushiobara (JP); Hitoshi Kanazawa, Utsunomiya (JP)

(72) Inventors: Motohisa Yokoi, Nasushiobara (JP); Kanta Kobuchi, Otawara (JP); Sho Kawajiri, Nasushiobara (JP); Masaaki Yamanaka, Nasushiobara (JP); Naoki Imamura, Nasushiobara (JP); Hitoshi Kanazawa, Utsunomiya (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 780 days.

(21) Appl. No.: 13/682,846

(22) Filed: Nov. 21, 2012

(65) Prior Publication Data

US 2013/0127467 A1    May 23, 2013

(30) Foreign Application Priority Data

Nov. 22, 2011 (JP) .................... 2011-255555
Sep. 20, 2012 (JP) .................... 2012-207653

(51) Int. Cl.
*G01V 3/00* (2006.01)
*G01R 33/34* (2006.01)
*G01R 33/48* (2006.01)
*G01R 33/54* (2006.01)
*G01R 33/36* (2006.01)
*G01R 33/385* (2006.01)

(52) U.S. Cl.
CPC ............. *G01R 33/34* (2013.01); *G01R 33/48* (2013.01); *G01R 33/543* (2013.01); *G01R 33/3614* (2013.01); *G01R 33/3852* (2013.01)

(58) Field of Classification Search
CPC ........................................... G01R 33/34
USPC ........................................... 324/318
See application file for complete search history.

(56) References Cited

U.S. PATENT DOCUMENTS

| 2002/0131553 | A1 | 9/2002 | Tsuchino |
| 2005/0206769 | A1* | 9/2005 | Kump ............... G06F 1/206 348/333.01 |
| 2006/0169907 | A1 | 8/2006 | Shinden |
| 2011/0210739 | A1 | 9/2011 | Ham |

(Continued)

FOREIGN PATENT DOCUMENTS

JP    2011-156113    8/2011

OTHER PUBLICATIONS

Office Action issued Jun. 20, 2014 in CN Patent Application No. 201210477854.X.

(Continued)

*Primary Examiner* — Rodney Fuller
(74) *Attorney, Agent, or Firm* — Nixon & Vanderhye P.C.

(57) ABSTRACT

According to one embodiment, a magnetic resonance imaging apparatus includes a mode switching part and an imaging system. The mode switching part is configured to put a circuit system consuming a power into a shutdown state when a first trigger has been detected and put the circuit system being the shutdown state into a startup state when a second trigger has been detected. The first trigger shows that an imaging does not start for a certain period. The second trigger shows that the imaging starts. The imaging system is configured to perform the imaging by using the circuit system being the startup state.

14 Claims, 8 Drawing Sheets

(56) References Cited

U.S. PATENT DOCUMENTS

| | | | |
|---|---|---|---|
| 2012/0112747 A1* | 5/2012 | Alexiuk | G01R 33/288 324/318 |
| 2012/0268074 A1* | 10/2012 | Cooley | H01G 11/58 320/130 |
| 2013/0125130 A1* | 5/2013 | Stubbs | G06F 1/329 718/104 |
| 2014/0010566 A1* | 1/2014 | Takahashi | G03G 15/80 399/88 |
| 2014/0071479 A1* | 3/2014 | Hikichi | H04N 1/00896 358/1.14 |
| 2014/0344620 A1* | 11/2014 | Ma | G06F 9/442 714/24 |
| 2014/0363062 A1* | 12/2014 | Han | G06K 9/4642 382/128 |
| 2015/0103224 A1* | 4/2015 | Min | H04N 5/2252 348/333.13 |

OTHER PUBLICATIONS

Office Action issued Mar. 19, 2015 in CN Patent Application No. 201210477854.X.

* cited by examiner

MAGNETIC RESONANCE IMAGING APPARATUS AND MAGNETIC RESONANCE IMAGING METHOD

CROSS REFERENCES TO RELATED APPLICATIONS

This application is based upon and claims the benefit of priorities from Japanese Patent Application No. 2011-255555 filed on Nov. 22, 2011 and Japanese Patent Application No. 2012-207653 filed on Sep. 20, 2012; the entire contents of Japanese Patent Application No. 2011-255555 and Japanese Patent Application No. 2012-207653 are incorporated herein by reference.

FIELD

Embodiments described herein relate generally to a MRI (magnetic resonance imaging) apparatus and a magnetic resonance imaging method.

BACKGROUND

MRI is an imaging method which excites nuclear spin of an object set in a static magnetic field with a RF (radio frequency) signal having the Larmor frequency magnetically and reconstructs an image based on MR (magnetic resonance) signals generated due to the excitation.

The MRI apparatus is designed so that the systems including the gradient power supply are always in an on-state in order to obtain images of an urgent patient promptly. Specifically, when the driving system of the MRI apparatus starts up, subsystems including the gradient power supply associated with the driving system become constantly in the system ready state.

Furthermore, due to the increase in the speed of imaging for the MRI apparatus, the maximum output power of the gradient power supply reaches from a few watts to tens of megawatts. The reason why such a large amount of output becomes available is that the output circuit of the gradient power supply is composed of a high-speed switch circuit with a semiconductor.

However, as a disadvantage of the high-speed switch circuit used for the gradient power supply, the problem occurs that there is still a few kilowatts of the power consumption even in the state with no power output. Furthermore, even when it is not being imaged, there is power consumption in the various parts configuring the driving system of the MRI apparatus as well as the high-speed switch circuit. Therefore, it is desirable to reduce more power consumption for the MRI apparatus.

Accordingly, it is an object of the present invention to provide a magnetic resonance imaging apparatus and a magnetic resonance imaging method which make it possible to reduce the power consumption.

DETAILED DESCRIPTION

In general, according to one embodiment, a magnetic resonance imaging apparatus includes a mode switching part and an imaging system. The mode switching part is configured to put a circuit system consuming a power into a shutdown state when a first trigger has been detected and to put the circuit system when in the shutdown state into a startup state when a second trigger has been detected. The first trigger shows that an imaging operation does not start for a certain period. The second trigger shows that the imaging operation starts. The imaging system is configured to perform imaging by using the circuit system being in the startup state.

Further, according to another embodiment, a magnetic resonance imaging apparatus includes a mode switching part and an imaging system. The mode switching part is configured to put a circuit system consuming power into a shutdown state when a first trigger has been detected and put the circuit system when in the shutdown state into a startup state when a second trigger has been detected. The first trigger indicates that a height of a table of a bed has become not more than a threshold or less than the threshold. The second trigger shows that an imaging operation starts. The imaging system is configured to perform imaging by using the circuit system being in the startup state.

Further, according to another embodiment, a magnetic resonance imaging method includes: putting a circuit system consuming power into a shutdown state when a first trigger has been detected and putting the circuit system being in the shutdown state into a startup state when a second trigger has been detected; and performing imaging by using the circuit system being in the startup state. The first trigger indicates that imaging does not start for a certain period. The second trigger shows that imaging starts.

A magnetic resonance imaging apparatus and a magnetic resonance imaging method according to embodiments of the present invention will be described with reference to the accompanying drawings.

Figure 1:
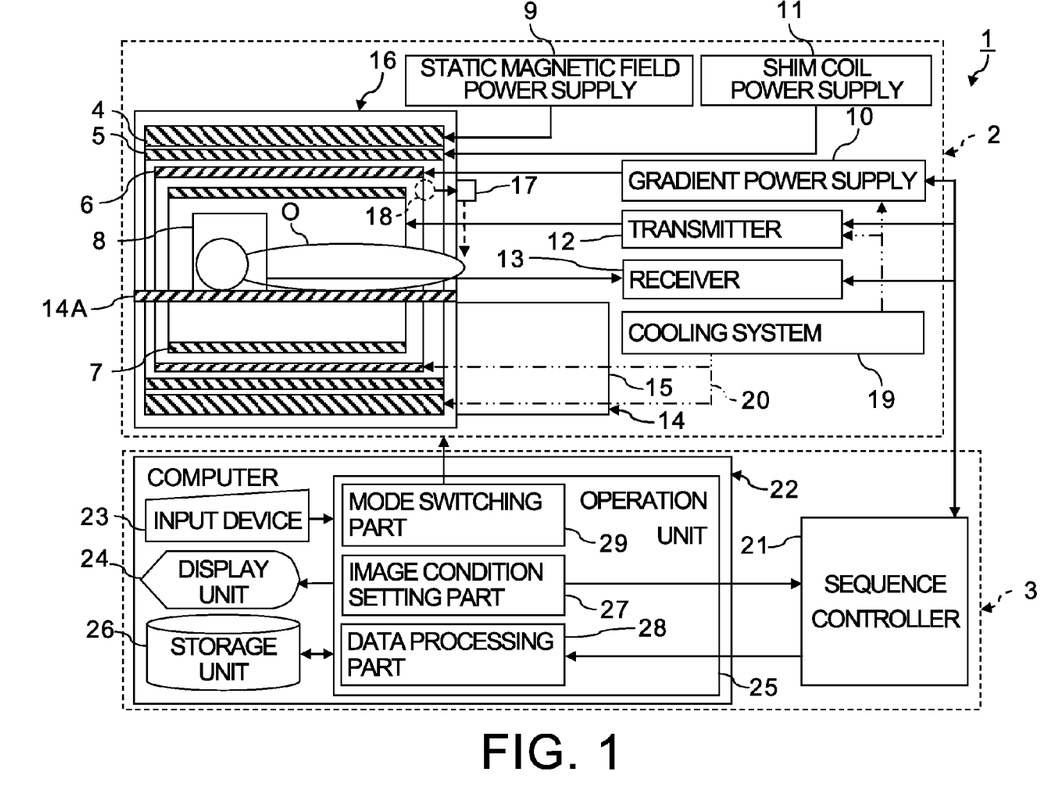
FIG. 1 is a configuration diagram of a magnetic resonance imaging apparatus according to an embodiment of the present invention.

FIG. 1 is a configuration diagram of a magnetic resonance imaging apparatus according to an embodiment of the present invention.

The magnetic resonance imaging apparatus 1 includes an imaging system 2 and a control system 3. The imaging system 2 includes elements such as a static field magnet 4, a shim coil 5, a gradient coil 6, a whole body coil (WBC) 7, a reception RF coil 8 of MR signals, a static magnetic field power supply 9, a gradient power supply 10, a shim coil power supply 11, a transmitter 12, a receiver 13 and a bed 14 to perform an imaging. A table 14A of the bed 14 can be moved by a bed driving unit 15. The cylindrical static field magnet 4, the shim coil 5, the gradient coil 6 and the WBC 7 composing the imaging system 2 are built in a gantry 16. Furthermore, an imaging area is formed inside the bore of the gantry 16.

The static field magnet 4 of the imaging system 2 forms the static magnetic field in the imaging area by receiving the power supply from the static magnetic field power supply 9. The shim coil 5 improves the uniformity of the static magnetic field by receiving the power supply from the shim coil power supply 11. The gradient coil 6 forms the gradient magnetic field in the imaging area by receiving the power supply from the gradient power supply 10. The transmitter 12 applies RF magnetic fields in the imaging area from the WBC 7 by outputting RF transmission signals to the WBC 7. The receiver 13 generates MR reception data by acquiring MR signals received by the WBC 7 or the reception RF coil 8 to perform the signal processing including the A/D (analog to digital) conversion.

Furthermore, an object O is set on the table 14A of the bed 14. The bed driving unit 15 moves the table 14A up-and-down or in the longitudinal direction. Specifically, when imaging starts, the bed driving unit 15 positions the table 14A with the set object O, to a predetermined height, and sends the table 14A with the object O into the gantry 16 where the imaging area is formed. Meanwhile, when imaging completes, the bed driving unit 15 moves the table 14A, which has been sent into the gantry 16, to top of the bed 14, and moves down the table 14A, as needed.

The opening part of the gantry 16 has a floodlight 17 to irradiate light for positioning toward the table 14A. An operation button 18 of the floodlight 17 is provided on the gantry 16, and the operating information of the floodlight 17 under the operation button 18 is output to the control system 3.

Furthermore, the imaging system 2 includes a cooling system 19 to cool down the imaging system 2. The cooling system 19 is the system to cool down the equipments, such as mainly the static field magnet 4, the gradient coil 6, the gradient power supply 10 and the transmitter 12, of the imaging system 2 by circulating a cooling medium in the equipments of the imaging system 2 through cooling tubes 20.

The superconducting coils in the static field magnet 4 are cooled down by the liquid helium supplied from the cooling system 19 at all the times. Furthermore, the gradient coil 6, the gradient power supply 10 and the transmitter 12 can be cooled down by being supplied with cooling water from the cooling system 19. The amount of the cooling water supplied to the gradient coil 6, the gradient power supply 10 and the transmitter 12 can be controlled variably in the cooling system 19.

Meanwhile, the control system 3 controls the imaging system 2 including a sequence controller 21 and a computer 22, and has elements to generate MR image data based on MR signals acquired in the imaging system 2.

The sequence controller 21 controls the gradient power supply 10, the transmitter 12 and the receiver 13 in accordance with imaging conditions including a pulse sequence output from the computer 22. The computer 22 includes an input device 23, a display unit 24, an operation unit 25 and a storage unit 26. The operation unit 25 functions as an imaging condition setting part 27, a data processing part 28 and a mode switching part 29 by executing the program. Note that, circuits may be used to acquire the functions as the imaging condition setting part 27, the data processing part 28 and the mode switching part 29.

The imaging condition setting part 27 displays a setting screen of imaging conditions on the display unit 24, while the imaging conditions are set for outputting to the sequence controller 21 by the imaging condition setting part 27 in accordance with the instruction information input from the input device 23 through the setting screen.

The data processing part 28 performs the data processing including the image reconstruction processing of MR reception data input to the computer 22 from the receiver 13 through the sequence controller 21. Herewith, MR image data can be generated. For that purpose, the data processing part 28 displays the setting screen of the data processing conditions on the display unit 24, while the data processing of MR reception data is performed by the data processing part 28 hi accordance with the conditions input from the input device 23 through the setting screen. Furthermore, the data processing part 28 stores the generated MR image data in the storage unit 26 or displays the generated MR image data on the display unit 24.

The mode switching part 29 turns the circuit systems consuming the power of the imaging system 2, to the shutdown state when the mode switching part 29 detects the first trigger indicating that imaging does not start for a certain period. On the other hand, when detecting the second trigger indicating the start of imaging, the mode switching part 29 turns the circuit systems from the shutdown state to the startup state. That is, the mode switching part 29 has the function to switch the modes of the imaging system 2 between the standby mode and the power saving mode. The standby mode is the mode that can start imaging since the circuit systems of the imaging system 2 are in the startup state. Furthermore, the power saving mode is the mode consuming less power compared to that in the standby mode that can start imaging since a part of the circuit systems configuring the imaging system 2 is in the shutdown state.

Therefore, the imaging system 2 performs imaging by using the circuit systems that become the startup state by the control of the mode switching part 29. Specifically, the imaging system 2 starts imaging in the standby mode.

Furthermore, the mode switching part 29 controls the cooling system 19 to reduce the amount of or stop the cooling water supplied to the circuit systems in the shutdown state. On the other hand, the mode switching part 29 controls the cooling system 19 to increase the amount of or supply the cooling water to be supplied to the circuit systems that became the startup state from the shutdown state.

Each of the first trigger and the second trigger used for the circuit systems to switch to the shutdown state and to startup can be detected as a change of an arbitrary state of the apparatus. Specifically, the function to generate detection signals indicating changes in the apparatus states can be provided in a necessary part of the magnetic resonance imaging apparatus 1. Then, the mode switching part 29 can determine whether or not there are a completion and a start of imaging or the like by outputting the detection signals to the mode switching part 29.

In the example shown in FIG. 1, the mode switching part 29 is configured to acquire a position detection signal of the table 14A from the bed driving unit 15 as the information showing a change in an apparatus state as described above. Furthermore, the mode switching part 29 is configured to acquire operating information input to the computer 22 from the input device 23, as other information showing a change in another apparatus state. Then, the mode switching part 29 controls the operation of the circuit systems, that are the target of the switching to the shutdown state, by outputting switching control signals of ON/OFF to the circuit systems, based on a determination result of the completion and the start of imaging using the information indicative of the changes in the apparatus states.

The changes in the apparatus states to detect the completion and the start of imaging can be defined arbitrarily in advance. For example, a position of the table 14A, a state of the bed 14 and operating information of the magnetic resonance imaging apparatus 1 input to the computer 22 from the input device 23 can be associated with the completion and the start of imaging. Specifically, the mode switching part 29 can detect the first apparatus state indicating that imaging does not start for a certain period and the second apparatus state indicating the start of imaging, based on at least one of the position of the table 14A of the bed 14 and the operating information input from the input device 23. Then, the circuit systems can be shut down and started using the first and the second apparatus states that are detected as the first and the second triggers respectively.

The detection conditions of the first apparatus state based on a position of the table 14A or a state of the bed 14 include the time when the table 14A has been away from an imaging position by a predetermined distance, the time when an imaging part set on an object O has been away from the center of the magnetic field formed by the static field magnet 4, by a predetermined distance, due to movement of the table 14A, the time when the position of the table 14A in the horizontal direction has become the out limit position furthest from the gantry 16, the time when the position of the table 14A in the vertical direction has become lower than the height at which the table 14A can be sent into the gantry 16, the time when the height of the table 14A has become not more than or lower than a threshold, the time when the height of the table 14A has become the down limit position, the time when the table 14A has not been set on the bed 14, the time when the stretcher to set the table 14A on the bed 14 has not been arranged properly in a case of imaging using the stretcher, the time when a stretcher has not been connected to the bed 14, the time when the bed 14 has not been connected to the gantry 16 or the like.

Furthermore, the detection conditions of the first apparatus state based on the operating information input from the input device 23 include the time when a predetermined screen such as a setting screen of imaging conditions or image processing conditions has been closed by the operation of the input device 23 like a mouse, that is, the time when the completion instruction of a predetermined screen has been input to the computer 22 from the input device 23, the time when information designating an imaging part for a positioning with the floodlight 17 or the like has not been input to the computer 22 or the like.

Meanwhile, the detection conditions of the second apparatus state based on a position of the table 14A include the time when the position of the table 14A in the horizontal direction has not become the out limit position furthest from the gantry 16, the time when the height of the table 14A has become the up limit position or a predetermined height, the time when the height of the table 14A has not become the down limit position, the time when a position of an imaging part set on an object O has become not more than a predetermined distance from the center of the magnetic field formed by the static field magnet 4, by moving the table 14A, the time when the position of the table 14A has become not more than a predetermined distance from an imaging position, the time when the table 14A has been set on the bed 14, the time when the bed 14 has been connected to the gantry 16, the time when a stretcher to set the table 14A on the bed 14 has been arranged properly or the like.

Furthermore, the detection conditions of the second apparatus state based on the operating information input from the input device 23 includes the time when a predetermined screen such as a setting screens of imaging conditions or image processing conditions has been opened by the operation of the input device 23 like a mouse, that is, the time when the starting instruction of a predetermined screen has been input to the computer 22 from the input device 23, the time when information designating an imaging part for a positioning has been input to the computer 22 by pushing the operation button 18 of the floodlight 17 or the like, the time when the key starting an imaging has been pushed, the time when the starting instruction of a pulse sequence for adjustment has been input to acquire a frequency spectrum for each patient or the like.

As other examples, a completion and a start of an imaging can be detected based on information acquired from the OS (Operating System) of the computer 22, in a case in which the magnetic resonance imaging apparatus 1 or the OS has become the sleep mode, a case in which the sleep mode has been awaked or the like.

Note that, there is a possibility that the table 14A is moved to the out limit position once between imagings in case of imaging a same object O repeatedly. For example, the table 14A is moved once in order to inject a contrast agent into an object O in case of a contrast-enhanced imaging. Then, an imaging starts with moving the table 14A again after the contrast agent injection. In such a case, it is not desirable to be determined as an imaging does not start for a certain period by the mode switching part 29.

Then, the mode switching part 29 may be configured to determine the first apparatus state indicating a completion of an imaging and the second apparatus state indicating a start of an imaging by combining together instead of determining independently. For example, a condition can be set so as to determine a completion of an imaging when a setting screen of imaging conditions has been closed and a start of an imaging when the setting screen of imaging conditions has been opened next time.

Similarly, a combination of the time when the height of the table 14A has been out of the up limit position and the time when the height of the table 14A has become the up limit position, a combination of the time when the height of the table 14A has been out of the up limit position and the time when information designating an imaging part has been input to the computer 22 or the like can be set as conditions of the shutdown and the restart of the circuit systems.

On the contrary, by setting the detection condition of a completion of an imaging as a time when the table 14A has become the down limit position, a time when the table 14A has not been set on the bed 14, a time when a stretcher to set the table 14A on the bed 14 has not been arranged properly in a case of imaging using the stretcher, a time when a stretcher has not been connected with the bed 14, a time when the bed 14 has not been connected with the gantry 16 or the like, the mode switching part 29 can detect a change of an object O steadily. In this case, various conditions can be set as the detection condition of a start of an imaging.

Furthermore, the mode switching part 29 can also detect a change of an object O steadily by setting the detection condition of a start of an imaging as a time when instruction of starting a pulse sequence for an adjustment for each patient has been input. In this case, various conditions, including a time when the table 14A has been out of the up limit position, can be set as the detection condition of a completion of an imaging.

Note that, the mode switching part 29 may determine a completion or a start of an imaging when plural conditions have been met or any of plural conditions has been met. In this case, there is a possibility that the mode switching part 29 may repeatedly determine a determination condition of imaging completion or imaging start has been met. Accordingly, a malfunction prevention function can be provided in the mode switching part 29 so that the mode switching part 29 does not output the shutdown instruction signal or the startup instruction signal to circuit systems plural times continuously. Alternatively, the function not to respond to the second and subsequent instruction signals, in a case where the circuit systems receive the shutdown instruction signal or the startup instruction signal several times, may be provided with the circuit systems side.

Furthermore, there is a possibility that both a completion and a start of an imaging may be detected in a short time depend on the detection conditions of the completion and the start of the imaging. For example, a completion of an imaging may be detected when the table 14A has become the out limit position, and subsequently a start of an imaging may be detected in a very short period of time due to moving the table 14A immediately. In such a case, it is necessary to prevent a chattering by giving a startup instruction signal and a shutdown instruction signal to the circuit systems in a short time.

Accordingly, the chattering prevention function can be provided with the mode switching part 29 not so as to output a next instruction signal to the circuit systems until a certain period of time elapses. Alternatively, similar chattering prevention function may be provided with each circuit system not so as to respond to a next instruction signal until a certain period of time elapses.

As described above, the malfunction prevention function, for preventing repeatedly outputting the shutdown instruction signal or the startup instruction signal to the circuit systems several times, and the chattering prevention function, for preventing outputting a next instruction signal to each circuit system until a certain period of time elapses, can be provided with the mode switching part 29. Note that, a malfunction and a chattering in the control of the cooling system 19 can be prevented in principle by providing the malfunction prevention function and the chattering prevention function for the control of the circuit systems. However, the malfunction prevention function and the chattering prevention function for the control of the cooling system 19 may be provided with the mode switching part 29.

The detection of a completion and a start of imaging, and the controls of the circuit systems and the cooling system 19, including the above-mentioned malfunction prevention processing, by the mode switching part 29, can be performed in the background of the computer 22 automatically. This allows preventing the increase in a waiting time of an operator and realizing operations without unnatural feeling.

In addition, a function to display image information, showing a message to an operator that the circuit systems are in the shutdown state, on the display unit 24 and/or a function to start up the circuit systems when the startup instruction of the circuit systems in the shutdown state has been input from the input device 23 can be provided with the mode switching part 29. This makes it possible to make a prompt recovery of the circuit systems in the shutdown state by a manual operation of an operator at an emergency.

On the contrary, the function to shut down a circuit system when the shutdown instruction of the circuit system in the startup state has been input from the input device 23 can be provided with the mode switching part 29. This makes it possible to shut down circuit systems by a manual operation.

In case of a manual operation, the respective times to shut down and to start up the circuit systems can be designated. Specifically, the mode switching part 29 can detect the first trigger indicating that an imaging does not start for a certain period and the second trigger indicating a start of an imaging, based on the information of an operation schedule, such as an imaging plan input from the input device 23, of the magnetic resonance imaging apparatus 1.

As a concrete example, at a medical institution where the magnetic resonance imaging apparatus 1 is placed, an instruction to shut down the circuit systems can be given to the mode switching part 29 by a manual operation with the input device 23 when a break time such as a lunch break or a break time in a night operation begins. Further, a startup instruction of the circuit systems can be given to the mode switching part 29 according to a completion time of the break time. In this case, the mode switching part 29 acquires the instruction of shutting down the circuit systems from the input device 23 as the first trigger indicating that an imaging does not start for a certain period. Furthermore, the mode switching part 29 detects the second trigger indicating a start of an imaging by coming of a startup timing of the circuit systems according to a completion time of a break time input from the input device 23. In other words, time information is regarded as the second trigger.

Examples of the above-mentioned circuit systems of the imaging system 2 which become the targets to be controlled by the mode switching part 29 include circuits, such as a switch circuit and a high voltage generation circuit, included in output equipments such as the static magnetic field power supply 9, the shim coil power supply 11, the gradient power supply 10 and the transmitter 12. However, it is necessary for the superconducting coils in the static field magnet 4 to be cooled by the cooling system 19 constantly. Therefore, at least the circuits to drive the cooling system 19 to cool the superconducting coils in the static field magnet 4 are excluded from the circuit systems to be the targets to be controlled by the mode switching part 29.

The circuit systems whose amounts of power consumption are especially remarkable are the circuits included in the gradient power supply 10 and the radio frequency power supply of the transmitter 12. Accordingly, the circuit systems to be the switching targets in the shutdown state will be hereinafter described as the circuits included in the gradient power supply 10 and the transmitter 12.

Figure 2:
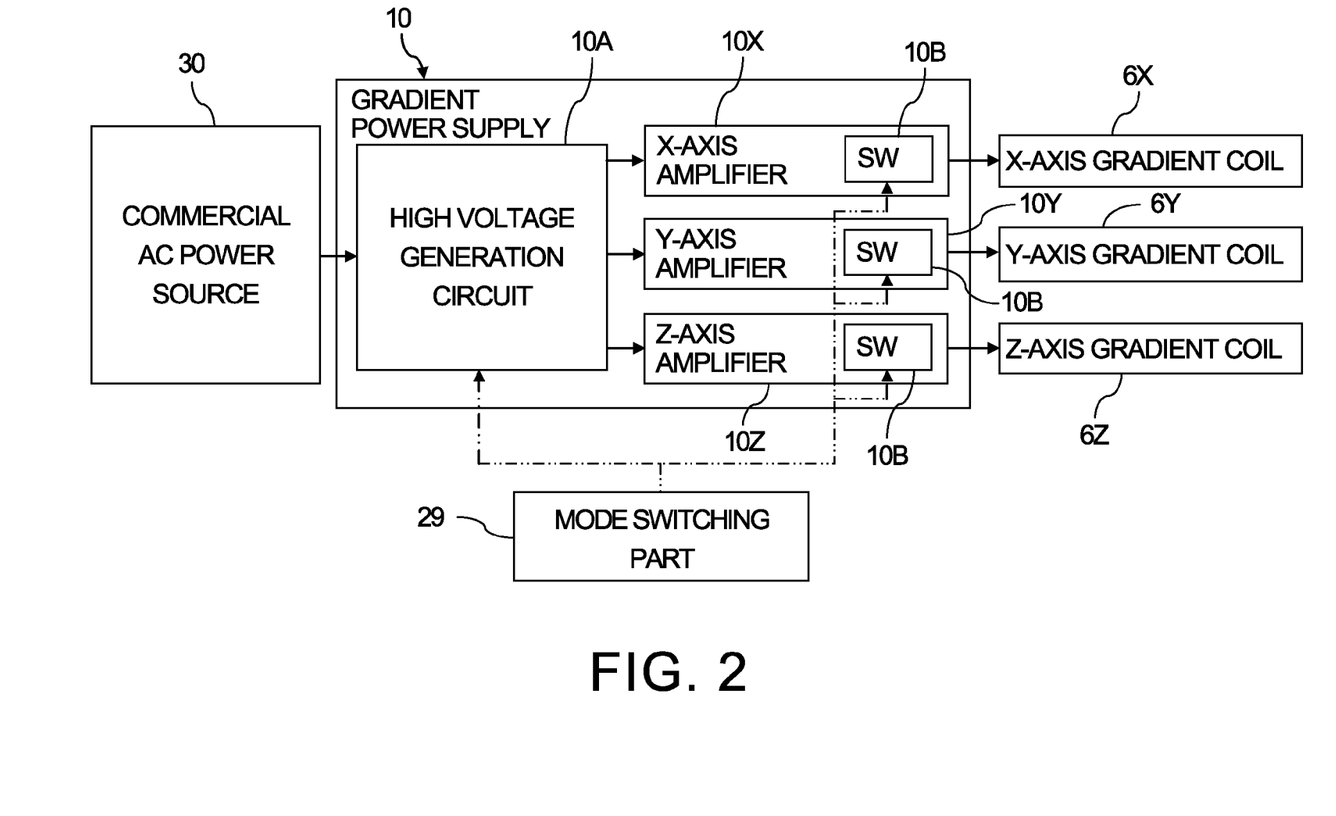
FIG. 2 is a detailed configuration diagram of the gradient power supply shown in FIG. 1.

FIG. 2 is a detailed configuration diagram of the gradient power supply 10 shown in FIG. 1.

As shown in FIG. 2, the gradient power supply 10 includes a high voltage generation circuit 10A, an X-axis amplifier 10X, a Y-axis amplifier 10Y and a Z-axis amplifier 10Z. The high voltage generation circuit 10A is connected to a commercial AC (Alternating Current) power source 30. Then, high-voltage currents generated in the high voltage generation circuit 10A are amplified respectively in the X-axis amplifier 10X, the Y-axis amplifier 10Y and the Z-axis amplifier 10Z and are output to an X-axis gradient coil 6X, a Y-axis gradient coil 6Y and a Z-axis gradient coil 6Z.

Specifically, the X-axis amplifier 10X, the Y-axis amplifier 10Y and the Z-axis amplifier 10Z function as output circuits of the gradient power supply 10. Each output circuit has a switch circuit 10B. Recently, a semiconductor switch circuit for an inverter is often used.

The circuits involving high power consumption in the gradient power supply 10 are mainly the semiconductor switch circuit and the high voltage generation circuit 10A. Accordingly, the switch circuit 10B and the high voltage generation circuit 10A can be switched and controlled by the mode switching part 29 as shown in FIG. 2.

Figure 3:
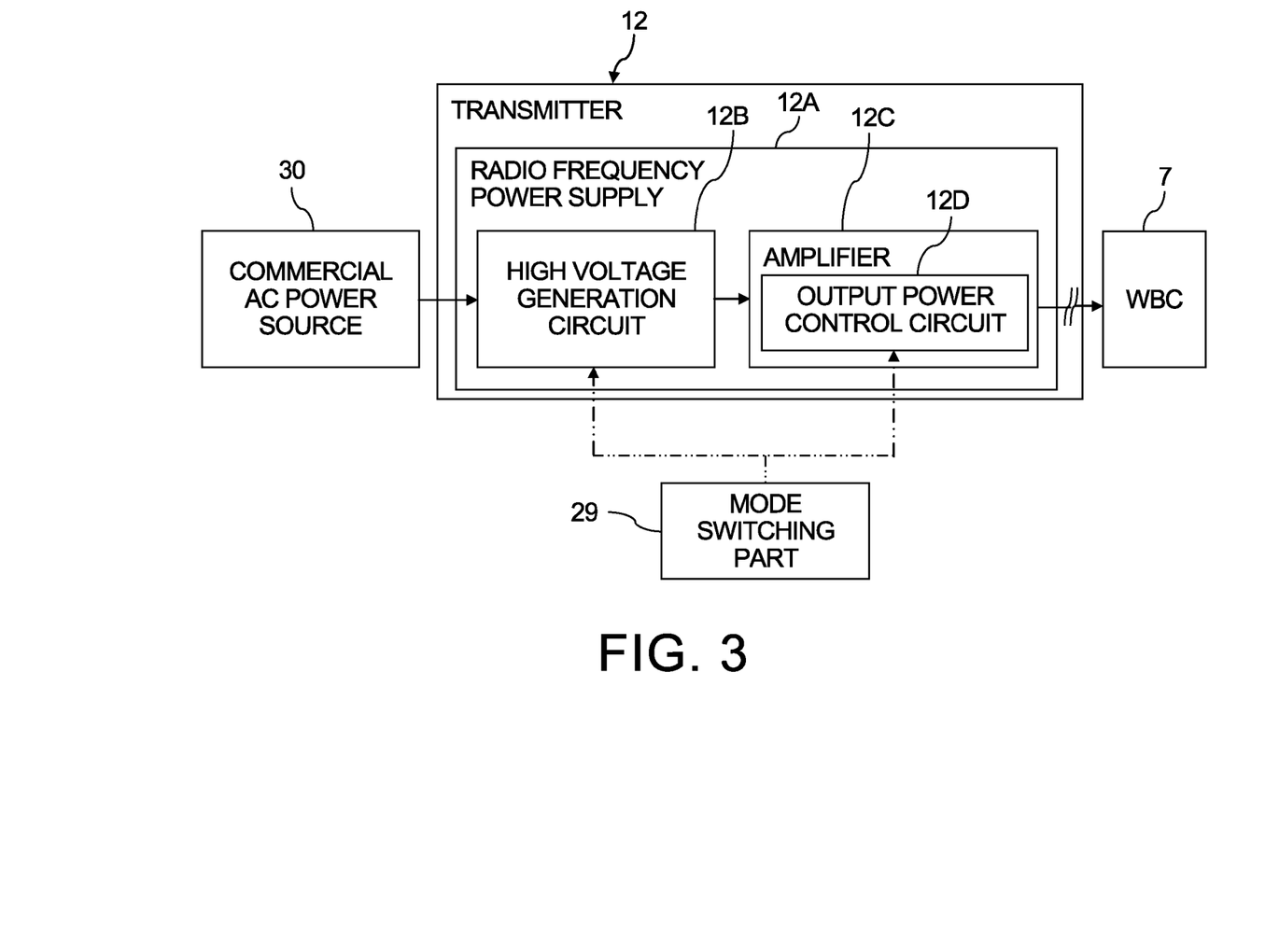
FIG. 3 is a detailed configuration diagram of a radio frequency power supply included in the transmitter shown in FIG. 1.

FIG. 3 is a detailed configuration diagram of a radio frequency power supply included in the transmitter 12 shown in FIG. 1.

As shown in FIG. 3, the radio frequency power supply 12A included in the transmitter 12 has a high voltage generation circuit 12B and an amplifier 12C. The high voltage generation circuit 12B is connected to a commercial AC power source 30. Then, a high-voltage current generated in the high voltage generation circuit 12B is amplified in the amplifier 12C and output to the WBC 7 as a transmission RF coil via other circuits of the transmitter 12. The amplifier 12C of the radio frequency power supply 12A has an output power control circuit 12D.

The circuits involving high power consumption in the radio frequency power supply 12A are the output power control circuit 12D and the high voltage generation circuit 12B. Accordingly, the output power control circuit 12D and the high voltage generation circuit 12B can be switched and controlled by the mode switching part 29 as shown in FIG. 3.

As described above, by setting the circuits involving high power consumption as the switching targets in the shutdown state, the power can be satisfactorily saved. Note that, not limited to the examples shown in FIG. 2 and FIG. 3, the circuit systems which are the switching targets in the shutdown state by the mode switching part 29 can be defined in advance as arbitrary circuits. For example, not limited only to an amount of power consumption, a startup time can be also set to a condition to determine the circuit systems to be the switching targets in the shutdown state.

Specifically, if circuits whose startup times are short and not more than a predetermined time are set as the switching targets in the shutdown state, it is possible to start up the circuits promptly to put them into the standby state for an imaging after once switching them into the shutdown state. Generally, it is said that people have more tendency to feel waiting when they wait for three seconds or more. Therefore, it is considered that the negative effect against operations by an operator can sufficiently reduced if the time lag from an instruction of starting an imaging, e.g., a time when an operator of the magnetic resonance imaging apparatus 1 pushed the imaging-start key displayed on the operating screen, to a startup of the circuit systems is kept within two seconds.

Therefore, if the circuit systems start up within a time derived by adding two seconds to a time from a change of an apparatus state, which becomes the second trigger for the startup of the circuit systems, to an instruction of starting an imaging made by an operator, the operation can be performed smoothly.

As a concrete example, it is anticipated that at least four seconds are required from the time when a detection condition of starting imaging as described above is determined to be met by the mode switching part 29 to the time when an operator actually pushes the imaging-start key. Therefore, it is considered that the circuit systems starting up within six econds make no problems with the operability even though those circuit systems are set as the switching targets in the shutdown state by the mode switching part 29. Furthermore, if the circuit systems can start up within one second, an operator will have no stress even though a time at which the imaging-start key has been pushed is set as the detection condition of a start of imaging.

On the contrary, it is possible to determine the detection condition of starting imaging according to times required to start up the circuit systems so that the operability becomes trouble-free. For example, the startup and the shutdown of the switch circuit for the control in the conventional gradient power supply 10 may require a time not less than 10seconds. Therefore, as for each circuit system mounting a switch circuit, a change of an apparatus state that happens approximately 10 seconds before the imaging-start key is pushed by an operator can be set as a detection condition of starting imaging by the mode switching part 29.

Furthermore, a semiconductor switch circuit for the control which is mounted in the recent gradient power supply 10 can start up and be shut down within six seconds. Some semiconductor switch circuits of a quick operation type can start up and be shut down in approximately one second. If a startup time of a circuit system is estimated to be not more than six seconds, it can be estimated that a moving distance of the table 14A during the startup of the circuit system is not more than 400 mm from a moving speed of the table 14A.

For that reason, by defining a time when the table 14A has been 400 mm away from an imaging position inside an imaging area or a time when an imaging part set in an object O has been 400 mm away from the center of the magnetic field by a movement of the table 14A as the first apparatus state that shows imaging does not start for a certain period, the circuit systems can start up until the next imaging starts. Similarly, by defining a time when an imaging part set in an object O has become not more than 400 mm away from the center of the magnetic field or a time when a position of the table 14A has become not more than 400 mm away from an imaging position as the second apparatus state that shows imaging starts, the circuit systems can start up by an actual start of imaging.

Furthermore, the conditions such as the distance as described above can be variably set according to the startup times of the circuit systems. For example, the first apparatus state that shows imaging does not start for a certain period can be defined as a time when the table 14A is out of the up limit position, i.e., after the table 14A became the out limit position, for shutting down the circuit systems while the second apparatus state that shows imaging starts can be defined as a time when the table 14A has become the up limit position, for starting up the circuit systems. In this case, it allows the circuit systems to start up with an enough time until the table 14A moves to an imaging position even if the startup of the circuit systems requires time.

As described above, the mode switching part 29 can detect the first apparatus state and the second apparatus state by the conditions with regard to a position of the table 14A determined based on the startup times of the circuit systems and the moving speed of the table 14A of the bed 14.

The circuit systems especially involving high power consumption and having short startup times in FIG. 2 are the semiconductor switch circuits in the output part of the gradient power supply 10. Therefore, it is desirable to set at least the semiconductor switch circuits of the gradient power supply 10 as the circuit systems to be the switching targets in the shutdown state. Furthermore, if an amount of power consumption of the high voltage generation circuit 10A of the gradient power supply 10 is relatively small, the high voltage generation circuit 10A may not be the switching target in the shutdown state. Meanwhile, if the startup time of the high voltage generation circuit 10A of the gradient power supply 10 is sufficiently short, the high voltage generation circuit 10A may be the switching target in the shutdown state.

Furthermore, regarding the high voltage generation circuit 12B of the radio frequency power supply 12A, if the amount of power consumption is small, the high voltage generation circuit 12B may not be the switching target in the shutdown state. Meanwhile, since the amount of power consumption of the output power control circuit 12D is large, it is desirable to set the output power control circuit 12D as the switching target in the shutdown state.

As mentioned above, the circuit systems have mutually different startup times respectively. Therefore, it is possible to classify the circuit systems into the circuit groups according to the ranges of the startup times to perform switching the circuit systems into the shutdown state or startup of the circuit systems under the mutually different conditions corresponding to the respective circuit groups. For example, the circuit systems that start up in not more than six seconds can be classified as the first circuit group and the circuit systems that require a time longer than six seconds to start up can be classified as the second circuit group. Then, the first circuit group can start up when the detection condition of starting imaging, of which time till an actual start of imaging is anticipated to be short, has met while the second circuit group can start up when the detection condition of starting imaging, of which time till an actual start of imaging is anticipated to be long, has been met.

Then, the operation and action of the magnetic resonance imaging apparatus 1 will be described.

Figure 4:
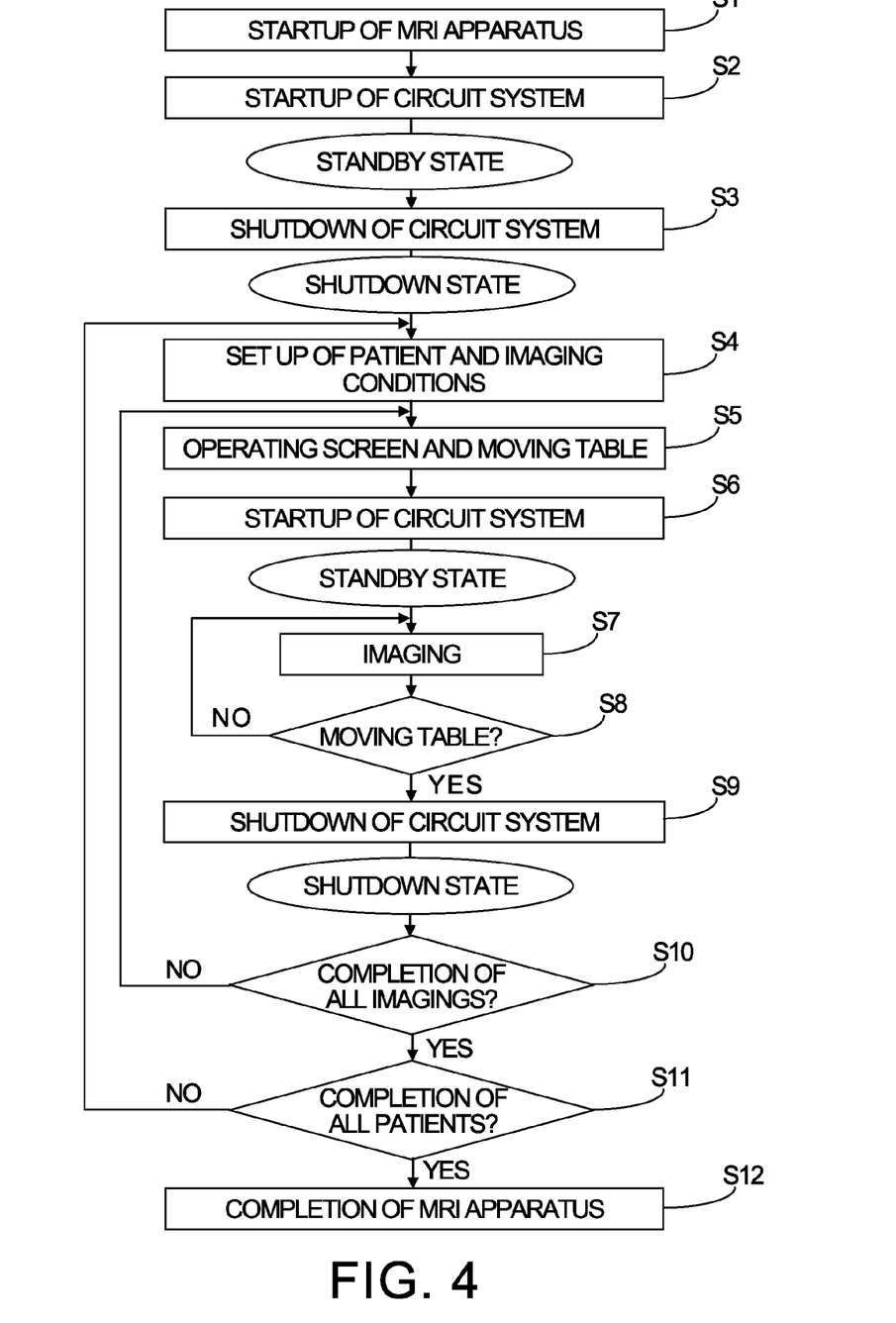
FIG. 4 is a chart showing the first example of a flow from a startup to a completion of the magnetic resonance imaging apparatus shown in FIG. 1.

FIG. 4 is a chart showing the first example of a flow from a startup to a completion of the magnetic resonance imaging apparatus 1 shown in FIG. 1.

Firstly, in step S1, the core system of the magnetic resonance imaging apparatus 1 starts up. Subsequently, in step S2, the circuit systems included in the gradient power supply 10, the radio frequency power supply 12A and the like start up. Herewith, the magnetic resonance imaging apparatus 1 becomes the standby state in which an imaging can be performed.

However, if the mode switching part 29 detects the first apparatus state, showing imaging does not start for a certain period, as a state of the magnetic resonance imaging apparatus 1 or operation by the input device 23, the mode switching part 29 shuts down the previously designated circuit systems by using the detection of the first apparatus state as the first trigger in step S3. Herewith, the circuit systems included in the gradient power supply 10, the radio frequency power supply 12A and the like become in the shutdown state.

Next, in step S4, the image condition setting part 27 displays the setting screen of imaging conditions on the display unit 24. Then, the image condition setting part 27 sets a patient and imaging conditions in accordance with patient information transmitted from a hospital system such as a hospital information system (HIS) or a radiology information system (RIS) through the network and instruction input by the input device 23. Meanwhile, a patient is set on the table 14A as an object O, and the table 14A with the object O is set on the bed 14.

Next, in step S5, the bed driving unit 15 drives by the operation of the input device 23 through the operating screen displayed on the display unit 24 and the height of the table 14A is controlled up to the up limit position. Subsequently, the bed driving unit 15 drives so that the table 14A moves in the horizontal direction to be positioned at an imaging position. Furthermore, the projector 17 operates as needed. Furthermore, the start of the imaging is instructed by the operation of the input device 23 through the operating screen displayed on the display unit 24.

Then, when the mode switching part 29 detects the second apparatus state that shows the imaging starts and is associated with an arbitrary operation in advance among these series of the operations, the mode switching part 29 starts up the circuit systems in the shutdown state with using the detection of the second apparatus state as the second trigger in step S6. Herewith, the magnetic resonance imaging apparatus 1 including the circuit systems becomes the standby state in which it is possible to perform an imaging.

Next, in step S7, the imaging is performed. Specifically, the image condition setting part 27 outputs the imaging conditions including the pulse sequence to the sequence controller 21. Then, the sequence controller 21 controls the gradient power supply 10, the transmitter 12 and the receiver 13. Accordingly, the gradient coil 6 forms gradient magnetic fields in the imaging area with the power supply by the gradient power supply 10. Furthermore, the WBC 7 converts RF transmission signals received from the transmitter 12 into RF magnetic fields to apply the RF magnetic fields in the imaging area.

As a result, MR signals generated in the object O are received by the reception RF coil 8 and output to the receiver 13. In the receiver 13, MR reception data consisting of digital signals is generated by the signal processing for the MR signals and output to the computer 22 through the sequence controller 21. Then, the data processing part 28 generates MR image data by data processing including the image reconstruction processing for the MR reception data. The generated MR image data is stored in the storage unit 26 and displayed on the display unit 24, as needed.

Then, similar imaging can be repeated for the necessary number of times. When imaging is completed, the bed driving unit 15 drives by the operation of the input device 23 through the operating screen displayed on the display unit 24 and the table 14A moves in the horizontal direction. Herewith, the table 14A becomes in the out limit position That is, imaging can be repeated until it is determined by the computer 22 that moving instruction of the table 14A has been input in step S8.

Then, when the mode switching part 29 detects the first apparatus state that shows imaging does not start for a certain period and is associated with an arbitrary operation in advance among these series of the operations, the mode switching part 29 shuts down the circuit systems specified in advance in step S9. Herewith, the circuit systems included in the gradient power supply 10, the radio frequency power supply 12A and the like become in the shutdown state. Note that, various states such as whether moving of the table 14A has started or not and/or whether the table 14A has been the out limit position or not can be defined as the first apparatus state.

Then, after necessary procedures and work such as injection of a contrast agent, imaging of the same patient can be performed repeatedly. In case of repeated imaging, it is determined that the all imagings for the same patient have not been completed at the determination of step S10. Then after imaging conditions are set as needed, the operations from step S5 to step S9 are performed again. Note that, though the determination of step S10 can be performed in the image condition setting part 27, an operator may also determine that When all imagings of the same patient are completed, it is determined yes at the determination of step S10. Then, imaging can be performed after changing a patient. In that case, it is determined that imagings for the all patients have not been completed at the determination of step S11. Then, the operations from step S4 to step S10 are performed again. Note that, though the determination of step S11 can be performed in the image condition setting part 27, an operator may also determine that.

When all imagings for all patients are completed, it is determined yes at the determination of step S11. Accordingly, in step S12, all systems, which are not constantly set in the on state, including the circuit systems and the core system of the magnetic resonance imaging apparatus 1 are completed.

That is, the example shown in FIG. 4 is repeating the shutdown and the startup of the circuit systems included in the gradient power supply 10, the radio frequency power supply 12A and the like whenever the table 14A moves to the out limit position. Accordingly, the power consumption of the circuit systems can be effectively saved when especially the startup time of each circuit system is short such as approximately one second.

Figure 5:
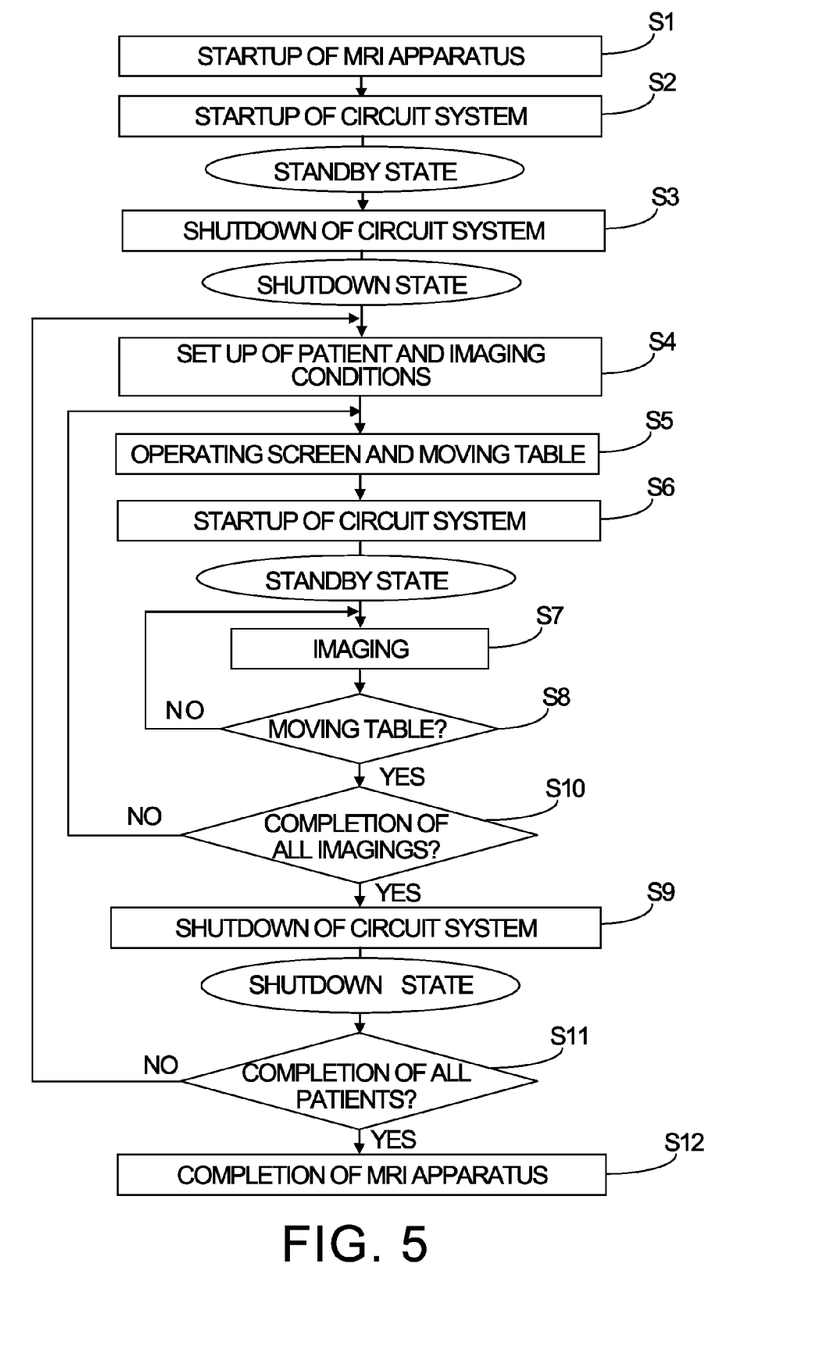
FIG. 5 is a chart showing the second example of a flow from a startup to a completion of the magnetic resonance imaging apparatus shown in FIG. 1.

FIG. 5 is a chart showing the second example of a flow from a startup to a completion of the magnetic resonance imaging apparatus 1 shown in FIG. 1. Note that, the same numbers are attached to the operations similar to those shown in FIG. 4 and explanation thereof is omitted.

In the example shown in FIG. 5, the operations including imaging from step S1 to step S8 are performed in a flow similar to that in the example shown in FIG. 4. However, the circuit systems are shut down as shown in step S9 when it is determined yes at the determination of whether the all imagings of a same patient have been completed or not in step S10. That is, the shutdown and the startup of the circuit systems are repeated whenever the table 14A moves to the out limit position regardless of whether a patient changes or not in the example shown in FIG. 4 while the shutdown and the startup of the circuit systems are repeated for each patient in the example shown in FIG. 5.

Accordingly, as the example shown in FIG. 5, if operation of the mode switching part 29 is set using conditions regarding apparatus states associated with a change of a patient, such as setting of a patient, whether the table 14A lies in the out limit position or not and the like, the power consumption of the circuit systems can be reduced without any problems in the operation even though the startup times of the circuit systems are long. Specifically, if the circuit systems start up before the first imaging of a patient by the detection of information of setting the patient or the like and not put into the shutdown state till a change of the patient by the detection of an apparatus state representing an exit of the patient, the increase of the imaging time can be almost ignored. Therefore, it is possible to save the power consumption with avoiding the increase in imaging time and the decrease in throughput of patients caused by the startup of the circuit systems.

Figure 6:
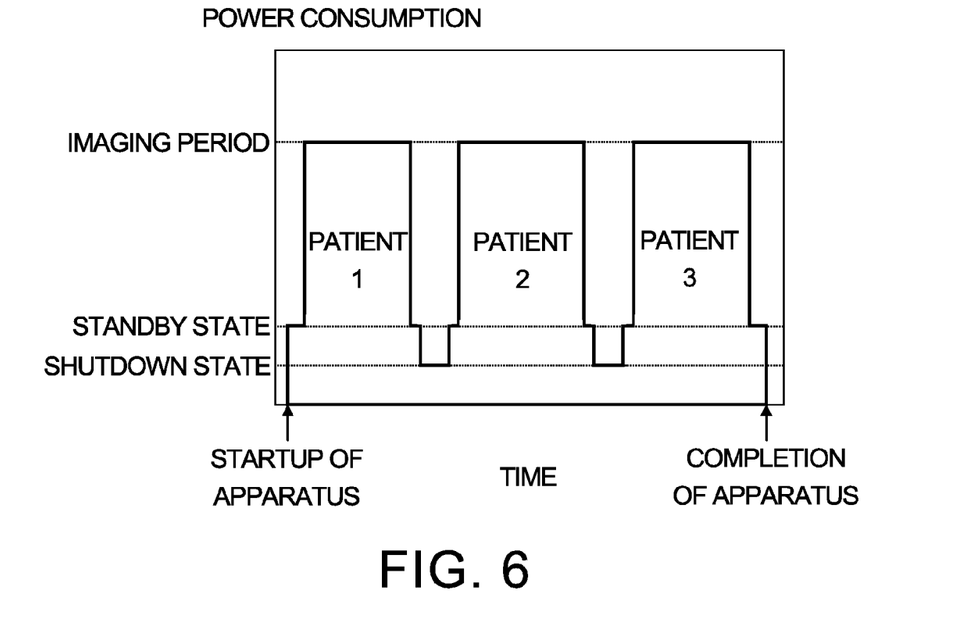
FIG. 6 is a schematic diagram showing a time change of power consumption of the magnetic resonance imaging apparatus in case of controlling the circuit system in the flow shown in FIG. 5.

FIG. 6 is a schematic diagram showing a time change of power consumption of the magnetic resonance imaging apparatus 1 in case of controlling the circuit system in the flow shown in FIG. 5.

In FIG. 6, the ordinate axis shows the total power consumption in the systems of the magnetic resonance imaging apparatus 1 that are not necessary to constantly be the startup state and the abscissa axis shows the time. As shown in FIG. 6, after starting up the circuit systems with the core system of the magnetic resonance imaging apparatus 1 and performing imagings of patients, the core system and the circuit systems can be completed. Just before each imaging, it becomes the standby state in which the circuit systems have started up. The power consumption is the highest during each imaging period and the power consumption occurs even in the standby state.

Accordingly, in each interval between the imaging periods for the respective patients, a part, involving high power consumption, of the circuit systems can be temporarily switched from the standby state to the shutdown state. Herewith, at least the power consumption during each period when an imaging is temporarily interrupted, like a time for a change of a patient, can be reduced. Note that, the shutdown state occurs in an interval between the standby states since the shutdown and the startup of the circuit systems to be the switching targets require times. Specifically, the power consumption changes stepwise as shown in FIG. 6.

As the examples shown in FIG. 5 and FIG. 6, it is possible to reduce the number of repetitions of the shutdown and the startup of the circuit systems by repeating the shutdown and the startup of the circuit systems for each patient, compared to a case of repeating the shutdown and the startup of the circuit systems for each imaging. As a result, it is possible to reduce the negative effect against a life span and reliability of the circuit systems due to repeating the shutdown and the startup.

As described above, it is possible to shut down or start up the circuit systems with using the changes in the apparatus states of the magnetic resonance imaging apparatus 1 as triggers, and it is also possible to shut down or start up the circuit systems with using time as a trigger.

Figure 7:
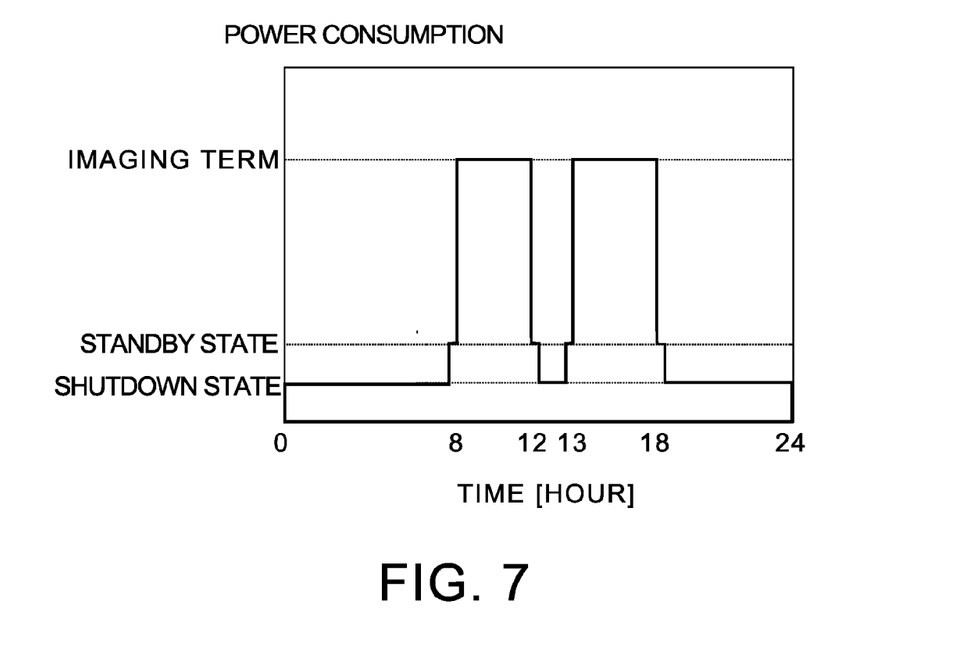
FIG. 7 is a schematic diagram showing a time change of power consumption of the magnetic resonance imaging apparatus in case of controlling the circuit system, include in the magnetic resonance imaging apparatus shown in FIG. 1, according to the one-day imaging schedule.

FIG. 7 is a schematic diagram showing a time change of power consumption of the magnetic resonance imaging apparatus 1 in case of controlling the circuit system, include in the magnetic resonance imaging apparatus 1 shown in FIG. 1, according to the one-day imaging schedule.

In FIG. 7, the ordinate axis shows the total power consumption of the respective systems configuring the magnetic resonance imaging apparatus 1 and the abscissa axis shows the time of a day. As shown in FIG. 7, it is possible to plan an imaging schedule of a day so as to start up the all circuit systems necessary for an imaging at 8:00 to switch them into the standby state in which an imaging can start and so as to put a part involving high power consumption of the circuit systems into the shutdown state at 18:00. Furthermore, during the lunch break time from 12:00 to 13:00 and the time from 18:00 to 8:00 of the next day, the part involving the high power consumption of the circuit systems can be put into the shutdown state so that the part can be switched into the standby state by a manual operation in case of emergency.

Even in this case, similarly to the example shown in FIG. 6, the shutdown state occurs in each interval between the standby states since a time is required for the shutdown and the startup of the circuit systems to be the switching targets. If time is used as a trigger of the shutdown or the startup of the circuit systems as shown in FIG. 7, it is possible to shut down or start up the circuit systems at a desired timing when a change in an apparatus state does not occur.

Of course, both time and changes in apparatus states can be used as the triggers for the shutdown or the startup of the circuit systems. For example, during the imaging term shown in FIG. 7, switching the circuit systems between the shutdown and the startup can be performed for each patient as shown in FIG. 6.

Figure 8:
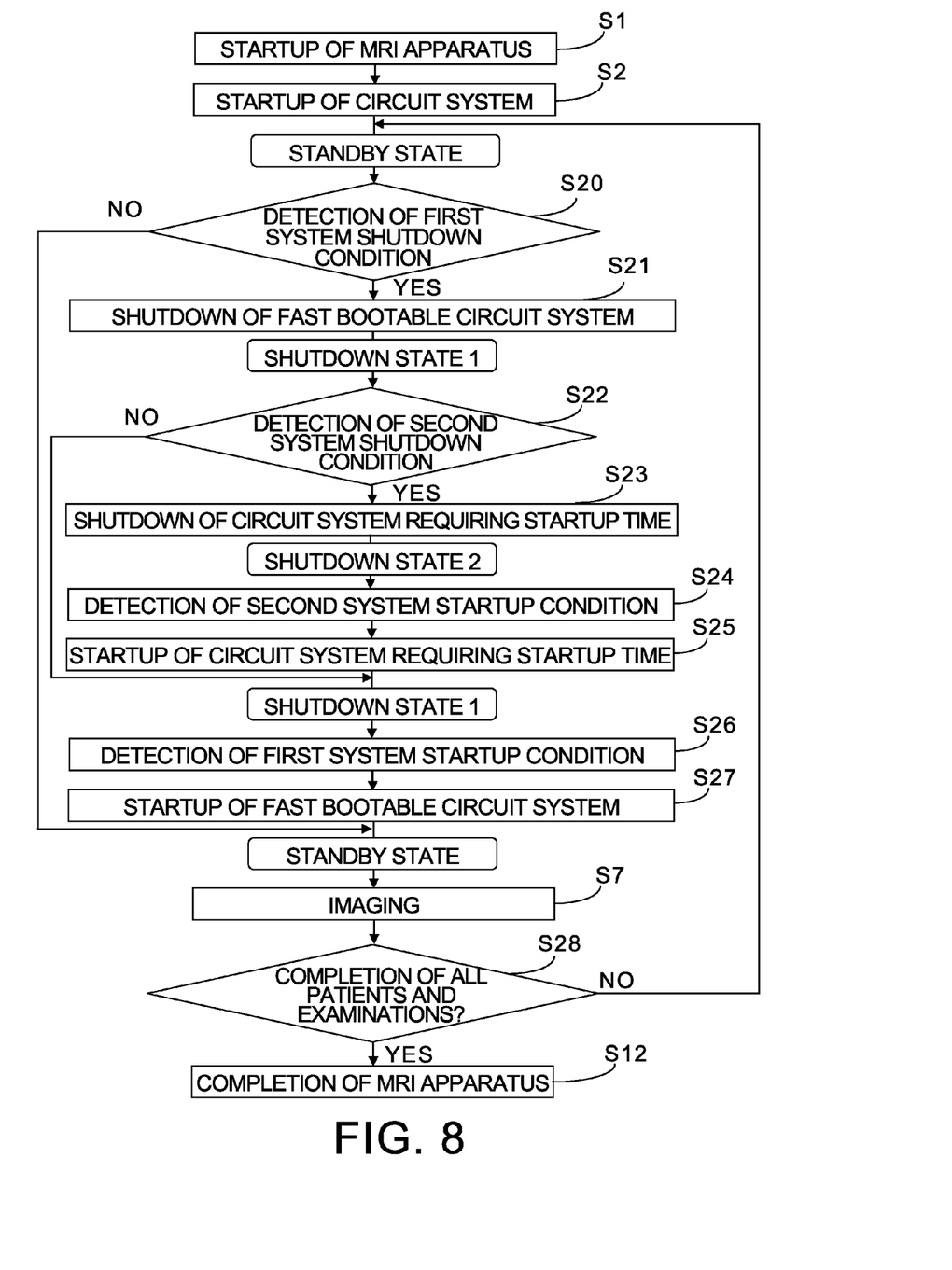
FIG. 8 is a chart showing the third example of a flow from a startup to a completion of the magnetic resonance imaging apparatus shown in FIG. 1.

FIG. 8 is a chart showing the third example of a flow from a startup to a completion of the magnetic resonance imaging apparatus 1 shown in FIG. 1. Note that, the same numbers are attached to the operations similar to those shown in FIGS. 4 and 5 and explanation thereof is omitted.

In the third example shown in FIG. 8, the circuit systems are classified into two circuit groups according to each startup time to control the circuit groups by setting shutdown conditions and startup conditions to the respective circuit groups. Specifically, circuit systems each involving high power consumption are previously determined as switching targets in the shutdown state by the mode switching part 29.

Then, among the circuit systems to be the switching targets into the shutdown state, circuit systems having a short startup time, for example, those which start up within six seconds are grouped into the first circuit group. Furthermore, among the circuit systems to be the switching targets into the shutdown state, the other circuit systems having a long startup time, for example, those which require a time longer than six seconds to start up are grouped into the second circuit group.

In addition, the first system shutdown condition to shut down the circuit systems that belong to the first circuit group, the first system startup condition to start up the circuit systems that belong to the first circuit group, the second system shutdown condition to shut down the circuit systems that belong to the second circuit group and the second system startup condition to start up the circuit systems that belong to the second circuit group are determined respectively. Note that, the second system shutdown condition is set to an apparatus state detected after the first system shutdown condition and showing imaging does not start for a certain period. Meanwhile, the second system startup condition is set to an apparatus state detected before the first system startup condition and showing a start of imaging. In addition, the respective apparatus states corresponding to these conditions are determined according to times required to start up and shut down the circuit systems that belong to the first and the second circuit groups.

Then, similarly to the first and the second examples shown in FIG. 4 and FIG. 5, the basic system of the magnetic resonance imaging apparatus 1 starts up in step S1. Subsequently in step S2, the circuit systems included in the gradient power supply 10, the radio frequency power supply 12A and the like start up. Herewith, the magnetic resonance imaging apparatus 1 becomes in the standby state which can perform imaging.

Next, the mode switching part 29 determines whether the apparatus state set as the first system shutdown condition has been detected or not in step S20. When it is determined that the apparatus state corresponding to the first system shutdown condition has been detected, the mode switching part 29 switches the circuit systems, that belong to the fastly bootable first circuit group, into the shutdown state in step S21. Herewith, the circuit systems that belong to the first circuit group become the shutdown state. That is, the power consumption is reduced compared to that in the standby state.

Next, the mode switching part 29 determines whether the apparatus state set as the second system shutdown condition has been detected or not in step S22. When it is determined that the apparatus state corresponding to the second system shutdown condition has been detected, the mode switching part 29 switches the circuit systems, that belong to the second circuit group requiring the startup time, into the shutdown state in step S23. Herewith, the circuit systems that belong to the first and the second circuit groups become the shutdown state. Specifically, it becomes a state in which the power consumption is saved more.

Next, when the mode switching part 29 detects the apparatus state set as the second system startup condition in step S24, the mode switching part 29 starts up the circuit systems that belong to the second circuit group requiring the startup time in step S25. Herewith, the magnetic resonance imaging apparatus 1 becomes a state in which the magnetic resonance imaging apparatus 1 can be the standby state fastly, within six seconds to be more precise.

Meanwhile, when the mode switching part 29 does not detect the apparatus state set as the second system shutdown condition in step S22, the circuit systems that belong to the second circuit group keep the startup state.

Next, when the mode switching part 29 detects the apparatus state set as the first system startup condition in step S26, the mode switching part 29 starts up the circuit systems that belong to the first circuit group which can start up fastly, within six seconds to be more precise in step S27. Herewith, the magnetic resonance imaging apparatus 1 becomes the standby state which can start an imaging.

Meanwhile, when the mode switching part 29 does not detect the apparatus state set as the first system shutdown condition in step S20, the circuit systems that belong to the first circuit group keep the startup state. That is, the standby state of the magnetic resonance imaging apparatus 1 is maintained.

Then, in step S7 in the standby state, an imaging can be performed. When the imaging is completed, the mode switching part 29 determines whether the all imagings for the all patients have been completed or not in step S28. In a case of performing an additional imaging, the determinations, the operations and the like from step S20 to step S7 are performed again. Specifically, the shutdown and the startup of the circuit systems are repeated for each imaging or each patient. Meanwhile, when the all imagings for the all patients have been completed, all systems, not being constantly on state, including the circuit systems and the mission critical system of the magnetic resonance imaging apparatus 1 are completed in step S12.

Next, the description of the fourth example about the flow from the startup to the completion of the magnetic resonance imaging apparatus 1 shown in FIG. 1 will be given.

Figure 9:
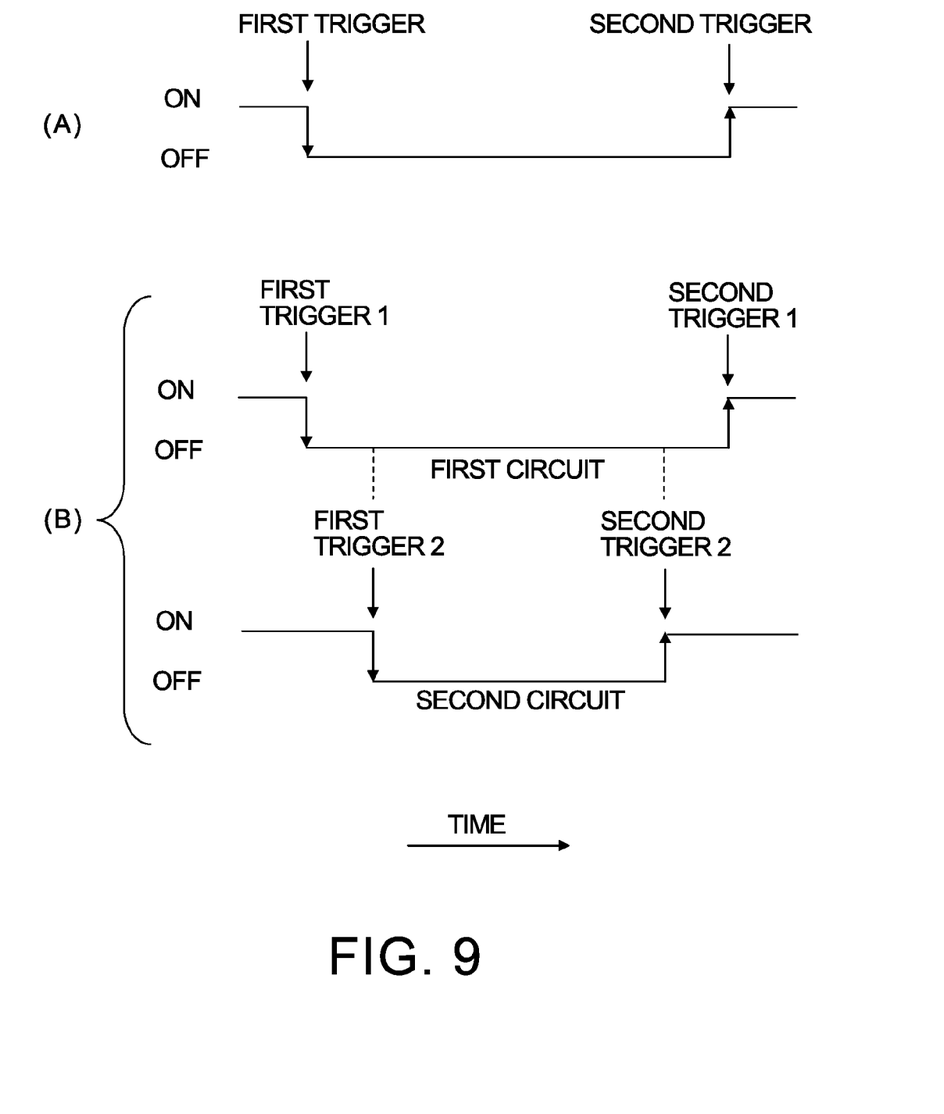
FIG. 9 is a chart showing an example of setting power saving modes, corresponding to startup times, to be selectable with targeting circuit systems included in the gradient power supply shown in FIG. 2.

FIG. 9 is a chart showing an example of setting power saving modes, corresponding to startup times, to be selectable with targeting circuit systems included in the gradient power supply 10 shown in FIG. 2.

In FIG. 9, the abscissa axis direction shows the time and the ordinate axis direction shows whether the circuit systems are off state or on state. FIG. 9 (A) shows an example of setting a circuit group having a sufficiently short startup time as a target to be switched into the shutdown state at the power saving mode. Meanwhile, FIG. 9 (B) shows an example of setting the first circuit group having a sufficiently short startup time and the second circuit group having a long startup time as targets to be switched into the shutdown state at the power saving mode.

As shown in FIG. 9 (A), it is possible to set the first power saving mode in which the circuit systems each having a sufficiently short startup time, such as the switch circuit 10B of the gradient power supply 10, are put into the shutdown state when the first trigger is detected while the circuit systems are put into the startup state when the second trigger is detected. When each startup time of the circuit systems is sufficiently short, it is possible to use a detection signal, showing the stop button for a scan has been pushed, as the first trigger. Meanwhile, it is possible to use a detection signal, showing the start button for a scan has been pushed, as the second trigger.

Furthermore, as shown in FIG. 9 (B), it is possible to group the circuit systems into the first circuit group whose each startup time is shorter than a threshold and the second circuit group whose each startup time is longer than the threshold. A typical circuit system of the first circuit group whose each startup time is short is the switch circuit 10B of the gradient power supply 10. Meanwhile, a typical circuit system of the second circuit group whose each startup time is long is the high voltage generation circuit 10A of the gradient power supply 10.

Then, as the second power saving mode, it is possible to set the mutually different first trigger and second trigger according to the startup times for the first circuit group and the second circuit group respectively. As a highly practical example, the first trigger which becomes the shutdown condition of the first circuit group including at least the switch circuit 10B having a short startup time can be set to the detection signal showing the shutdown button for a scan has been pushed. Meanwhile, the second trigger which becomes the startup condition of the first circuit group can be set to the detection signal showing the start button for a scan has been pushed. That is, it is possible to set conditions similar to those in the case show in FIG. 9 (A).

On the other hand, the other first trigger which becomes the shutdown condition of the second circuit group including at least the high voltage generation circuit 10A having a long startup time can be set to the detection signal showing the table 14A has been out of the up limit position. Furthermore, the other second trigger which becomes the startup condition of the second circuit group can be set to the detection signal showing the table 14A has been the up limit position. Herewith, it becomes possible to set the power saving mode to even a circuit system whose startup time is long.

The two power saving modes shown in FIG. 9 (A) and (B) can be selected. Of course, only one power saving mode may be prepared in the magnetic resonance imaging apparatus 1.

The magnetic resonance imaging apparatus 1 described above is an apparatus configured to automatically recognize a start and a completion of an imaging respectively to switch circuit systems, whose power consumptions are relatively high, into the shutdown mode temporarily when they became the non-imaging state and restart the circuit systems being the shutdown mode when they become the imaging state.

Therefore, according to the magnetic resonance imaging apparatus 1, power consumption in power supplies can be reduced by approximately a few kilowatts in the non-imaging state. Specifically, subsystems each consuming power can be put into the shutdown state during a state, such as a time for replacing patients or a waiting time of a patient, when an imaging is not performed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    a mode switching part configured to put a circuit system consuming power into a shutdown state when a first trigger has been detected based on patient bed status information and to put the circuit system in the shutdown state into a startup state when a second trigger has been detected, the first trigger indicating that imaging does not start for a certain period, the second trigger showing that imaging is to start; and
    an imaging system configured to perform imaging by using the circuit system starting from the startup state.

2. A magnetic resonance imaging apparatus as in claim 1 wherein:
    said mode switching part is configured to put the circuit system into the shutdown state when the first trigger has been detected, the first trigger indicating that a height of a table of the patient bed has become not more than a threshold or less than the threshold.

3. A magnetic resonance imaging apparatus as in claim 1, wherein said mode switching part is configured to detect the first trigger and the second trigger based on of a position of a table of the patient bed.

4. A magnetic resonance imaging apparatus as in claim 1, wherein said mode switching part is configured to set a circuit system whose startup time is not more than a predetermined time as a switching target into the shutdown state.

5. A magnetic resonance imaging apparatus as in claim 1, wherein said mode switching part is configured to have at least one of (a) a malfunction prevention function which prevents outputting a shutdown instruction signal or a startup instruction signal to the circuit system several times repeatedly and (b) a chattering prevention function which prevents outputting a next instruction signal to the circuit system until a certain time has elapsed.

6. A magnetic resonance imaging apparatus as in claim 1, wherein said mode switching part is configured to switch circuit systems into the shutdown state or the startup state in different conditions according to startup times.

7. A magnetic resonance imaging apparatus as in claim 1, further comprising:
    a cooling system configured to cool down said imaging system by circulating cooling water in said imaging system,
    wherein said mode switching part is configured (a) to control said cooling system to reduce an amount of a cooling water supplied to the circuit system when in the shutdown state or to stop the cooling water supplied to the circuit system and (b) to control said cooling system to increase an amount of cooling water supplied to the circuit system when it changes to the startup state from the shutdown state or to supply cooling water to the circuit system when it changes to the startup state from the shutdown state.

8. A magnetic resonance imaging apparatus as in claim 1, wherein said mode switching part is configured to detect the first trigger and the second trigger under based on a condition of a position of a table of the patient bed, the position being determined based on a startup time of the circuit system and a moving speed of the table.

9. A magnetic resonance imaging apparatus as in claim 1, wherein:
    said mode switching part is configured (a) to put at least a high voltage generation circuit of a gradient power supply into the shutdown state when a detection signal showing that a table of the patient bed changed out of an up limit has been detected as the first trigger (b) and to put the high voltage generation circuit into the startup state when a detection signal showing that the table reached the up limit has been detected as the second trigger.

10. A magnetic resonance imaging apparatus as in claim 1, wherein:
    said mode switching part is configured to group circuit systems into a first circuit group where a startup time is shorter than a threshold and a second circuit group where the startup time is longer than the threshold and
    (a) to put the first circuit group into the shutdown state when a detection signal showing that a stop button for a scan was pushed has been detected as the first trigger,
    (b) to put the first circuit group into the startup state when a detection signal showing that a start button for the scan was pushed has been detected as the second trigger,
    (c) to put the second circuit group into the shutdown state when a detection signal showing that a table of the patient bed has changed out of an up limit has been detected as another first trigger, and
    (d) to put the second circuit group into the startup state when a detection signal showing that the table reached the up limit has been detected as another second trigger.

11. A magnetic resonance imaging apparatus as in claim 1, wherein said circuit system does not drive a cooling system a superconducting coil of a static field magnet.

12. A magnetic resonance imaging apparatus as in claim 1, wherein said circuit system includes a switch circuit of a gradient power supply.

13. A magnetic resonance imaging apparatus comprising:
a mode switching part configured to (a) put a circuit consuming power into a shutdown state when a first trigger has been detected and (b) put the circuit system when in the shutdown state into a startup state when a second trigger has been detected, the first trigger indicating that imaging does not start for a certain period of time, the second trigger indicating imaging start; and
an imaging system configured to perform imaging using the circuit system starting from the startup state;
wherein said mode switching part is configured to allow selection of a first power saving mode and a second power saving mode,
the first power saving mode putting at least a switch circuit of a gradient power supply into the shutdown state when the first trigger has been detected and putting the circuit system into the startup state when the second trigger has been detected,
the second power saving mode grouping circuit systems into a first circuit group and a second circuit group to put the first circuit group into the shutdown state when the first trigger has been detected, put the first circuit group into the startup state when the second trigger has been detected, put the second circuit group into the shutdown state when another first trigger has been detected and put the second circuit group into the startup state when another second trigger has been detected.

14. A magnetic resonance imaging method comprising:

transitioning a circuit system consuming power into a shutdown state when a first trigger has been detected based on patient bed status information and transitioning the circuit system from the shutdown state into a startup state when a second trigger has been detected, the first trigger indicating that imaging does not start for a certain period, the second trigger indicating that imaging is to starts start; and performing imaging using the circuit system starting from the startup state.

* * * * *